(12) United States Patent
Lee et al.

(10) Patent No.: US 8,173,989 B2
(45) Date of Patent: May 8, 2012

(54) RESISTIVE RANDOM ACCESS MEMORY DEVICE AND METHODS OF MANUFACTURING AND OPERATING THE SAME

(75) Inventors: Chang-bum Lee, Seoul (KR); Young-soo Park, Yongin-si (KR); Xianyu Wenxu, Suwon-si (KR); Bo-soo Kang, Seoul (KR); Seung-eon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 254 days.

(21) Appl. No.: 12/149,809

(22) Filed: May 8, 2008

(65) Prior Publication Data

US 2008/0296550 A1    Dec. 4, 2008

(30) Foreign Application Priority Data

May 30, 2007    (KR) .................. 10-2007-0052918
Mar. 5, 2008    (KR) .................. 10-2008-0020589

(51) Int. Cl.
*H01L 29/00*    (2006.01)
*H01L 47/00*    (2006.01)
*H01L 29/02*    (2006.01)
*H01L 29/04*    (2006.01)
*H01L 29/76*    (2006.01)
*G11C 11/00*    (2006.01)

(52) U.S. Cl. ......... 257/4; 257/1; 257/2; 257/3; 257/314; 257/E47.001; 365/148

(58) Field of Classification Search ........................ None
See application file for complete search history.

(56) References Cited

U.S. PATENT DOCUMENTS

| 5,709,958 | A | 1/1998 | Toyoda et al. |
|---|---|---|---|
| 6,034,882 | A | 3/2000 | Johnson et al. |
| 6,185,122 | B1 | 2/2001 | Johnson et al. |
| 6,724,580 | B2 | 4/2004 | Irie et al. |
| 6,781,172 | B2 * | 8/2004 | Moriya et al. ................ 257/295 |
| 6,870,755 | B2 | 3/2005 | Rinerson et al. |

(Continued)

FOREIGN PATENT DOCUMENTS

CN    1574363    2/2005

(Continued)

OTHER PUBLICATIONS

Korean Office Action dated Feb. 27, 2008 in corresponding Korean Application No. 10-2007-0052918.

(Continued)

*Primary Examiner* — N Drew Richards
*Assistant Examiner* — Michael Jung
(74) *Attorney, Agent, or Firm* — Harness, Dickey & Pierce, P.L.C.

(57) ABSTRACT

Provided may be a resistive random access memory (RRAM) device and methods of manufacturing and operating the same. The resistive random access memory device may include at least one first electrode, at least one second electrode spaced apart from the at least one first electrode, a first structure including a first resistance-changing layer between the at least one first and second electrodes, and a first switching element electrically connected to the first resistance-changing layer, wherein at least one of the first and second electrodes include an alloy layer having a noble metal and a base metal.

23 Claims, 9 Drawing Sheets

U.S. PATENT DOCUMENTS

| | | | |
|---|---|---|---|
| 6,872,963 B2 | 3/2005 | Kostylev et al. | |
| 6,891,749 B2 | 5/2005 | Campbell et al. | |
| 7,029,924 B2 | 4/2006 | Hsu et al. | |
| 7,538,338 B2 | 5/2009 | Rinerson et al. | |
| 2004/0245557 A1 | 12/2004 | Seo et al. | |
| 2004/0256697 A1 | 12/2004 | Jang | |
| 2005/0052915 A1 | 3/2005 | Herner et al. | |
| 2005/0145910 A1 | 7/2005 | Tamai et al. | |
| 2005/0146955 A1 | 7/2005 | Kajiyama | |
| 2005/0161726 A1 | 7/2005 | Shin et al. | |
| 2005/0174872 A1* | 8/2005 | Rinerson et al. | 365/225.7 |
| 2005/0266686 A1 | 12/2005 | Zhuang et al. | |
| 2006/0098472 A1* | 5/2006 | Ahn et al. | 365/145 |
| 2006/0120205 A1 | 6/2006 | Odagawa et al. | |
| 2006/0289942 A1 | 12/2006 | Horii et al. | |
| 2007/0012905 A1 | 1/2007 | Huang | |
| 2007/0014149 A1* | 1/2007 | Nagamine et al. | 365/158 |
| 2007/0051998 A1 | 3/2007 | Kil et al. | |
| 2007/0069241 A1* | 3/2007 | Yang et al. | 257/209 |
| 2007/0114508 A1 | 5/2007 | Herner et al. | |
| 2007/0120580 A1* | 5/2007 | Kim et al. | 326/93 |
| 2007/0228354 A1 | 10/2007 | Scheuerlein | |
| 2007/0290186 A1* | 12/2007 | Bourim et al. | 257/4 |
| 2007/0290214 A1 | 12/2007 | Ku et al. | |
| 2008/0116438 A1* | 5/2008 | Lee et al. | 257/2 |
| 2008/0121865 A1 | 5/2008 | Ahn et al. | |

FOREIGN PATENT DOCUMENTS

| | | |
|---|---|---|
| CN | 1652336 | 8/2005 |
| CN | 1790726 | 6/2006 |
| EP | 1657753 | 5/2006 |
| KR | 10-2005-0080662 | 8/2005 |
| KR | 10-2006-0018879 | 3/2006 |

OTHER PUBLICATIONS

European Search Report dated Oct. 23, 2008 in corresponding European Application No. 08157323.0-2222.

Myoung-Jae Lee et al.; Adv. Mater., vol. 19, pp. 73-76 (2007).

Ranju Jung et al.; Applied Physics Letters, vol. 91 (2); 022112-1-022112-3.

European Office Action dated Jul. 13, 2010 in corresponding European Application No. 08157323.0-2222.

Office Action dated Aug. 30, 2010 for corresponding Chinese Patent Application No. 200810108832.X with English translation.

English translation of Chinese Office Action dated Jul. 31, 2009 in corresponding Chinese Application No. 200610159882.1.

Chinese Office Action with English translation dated Dec. 31, 2010 for corresponding Chinese Patent Application No. 200710192709.6.

Chinese Office Action dated Nov. 6, 2009 in corresponding Chinese Application No. 200710192709.6.

* cited by examiner

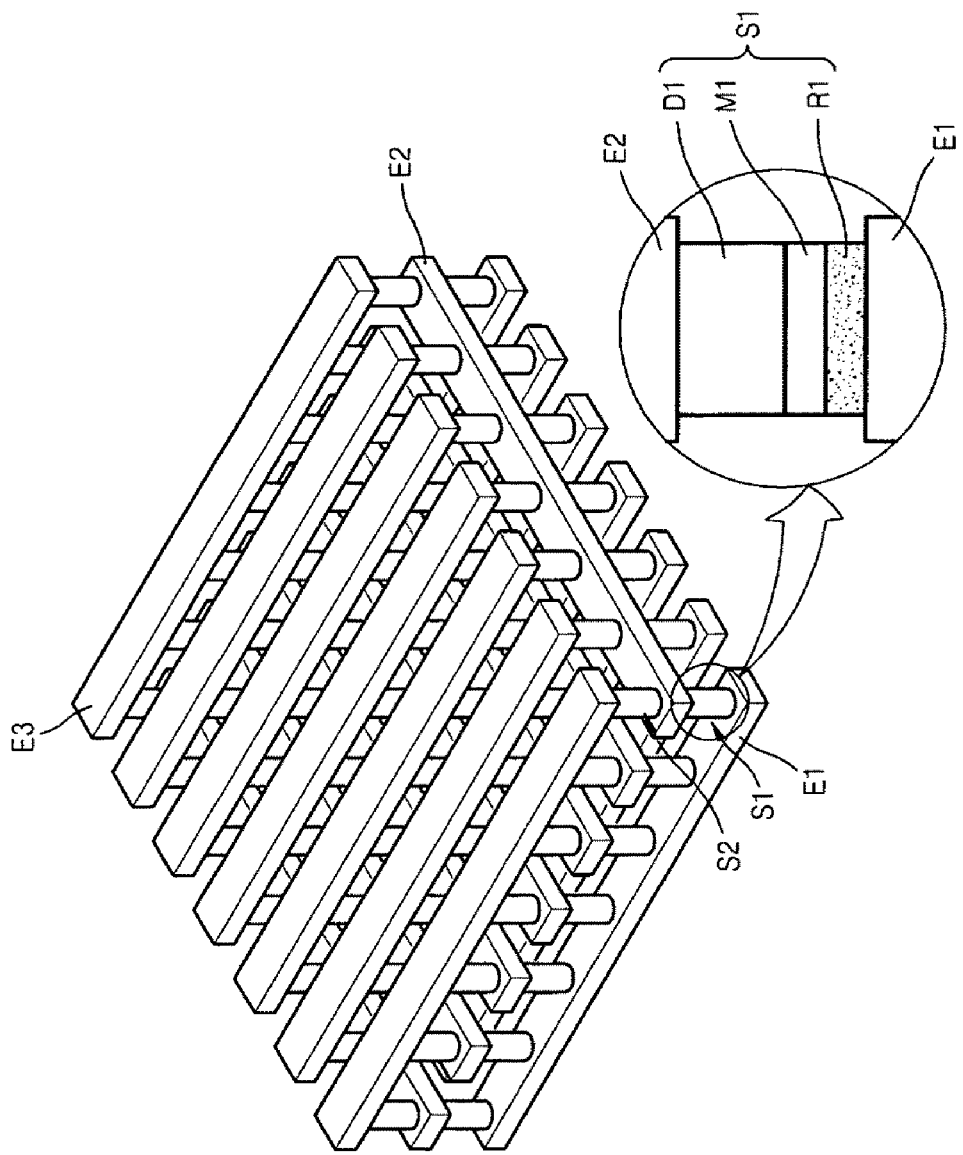

RESISTIVE RANDOM ACCESS MEMORY DEVICE AND METHODS OF MANUFACTURING AND OPERATING THE SAME

PRIORITY STATEMENT

This application claims priority under U.S.C. §119 to Korean Patent Applications Nos. 10-2007-0052918 and 10-2008-0020589, filed on May 30, 2007 and Mar. 5, 2008, in the Korean Intellectual Property Office (KIPO), the entire contents of which are incorporated herein by reference.

BACKGROUND

1. Field

Example embodiments relate to a semiconductor device and methods of manufacturing and operating the same. Other example embodiments relate to a resistive random access memory device and methods of manufacturing and operating the same.

2. Description of the Related Art

A resistive random access memory (RRAM) device is a non-volatile memory device that changes the resistance of a material, for example, a transition metal oxide, at a particular voltage. When a voltage equal to or greater than a set voltage is applied to a resistance-changing material, the resistance of the resistance-changing material may be reduced, which corresponds to an ON state. When a voltage equal to or greater than a reset voltage is applied to the resistance-changing material, the resistance of the resistance-changing material may be increased, which corresponds to an OFF state. A multi-layer cross point RRAM has an advantage of higher integration due to its simpler cell structure.

A storage node of a RRAM has a structure in which a lower electrode, a resistance-changing layer formed of a resistance-changing material, and an upper electrode may be sequentially stacked. A conventional RRAM may use nickel oxide ($NiO_x$) as the resistance-changing layer, and platinum (Pt) may be used as the lower and the upper electrodes.

SUMMARY

To solve the above and/or other problems, example embodiments provide a resistive random access memory (RRAM) device that includes an electrode having reduced manufacturing costs and increased adhesiveness with other films and methods of manufacturing and operating the same.

According to example embodiments, a resistive random access memory device may include at least one first electrode, at least one second electrode spaced apart from the at least one first electrode, a first structure including a first resistance-changing layer between the at least one first and second electrodes, and a first switching element electrically connected to the first resistance-changing layer, wherein at least one of the first and second electrodes include an alloy layer having a noble metal and a base metal.

According to example embodiments, a method of manufacturing a resistive random access memory device may include providing at least one second electrode spaced apart from at least one first electrode, providing a first structure including a first resistance-changing layer between the at least one first and second electrodes, and electrically connecting a first switching element to the first resistance-changing layer, wherein at least one of the first and second electrodes include an alloy layer having a noble metal and a base metal.

According to example embodiments, a method of operating a resistive random access memory device may include maintaining a switching element connected to a resistance-changing layer in an ON state; and applying an operating voltage equal to or greater than a set voltage Vs to the resistance-changing layer between upper and lower electrodes, wherein at least one of the upper and lower electrodes include an alloy layer having a noble metal and a base metal.

According to example embodiments, a method of operating a resistive random access memory (RRAM) device may include maintaining a switching element connected to a resistance-changing layer in an OFF state; and applying a voltage equal to or greater than a reset voltage Vr to the resistance-changing layer between upper and lower electrodes, wherein at least one of the upper and lower electrodes include an alloy layer having a noble metal and a base metal.

The noble metal may be any one selected from Pt, Ir, Ru, Pd and Au. The alloy layer may be formed of at least one from the group consisting of a binary alloy and a ternary alloy. The alloy layer may be a Pt—Ti alloy layer or a Pt—Ni alloy layer. The context X (mol %) of Ti may be about $0<X\leq$ about 40, in the Pt—Ti alloy layer. The content Y (mol %) of Ni may be about $0<Y\leq$ about 90, in the Pt—Ni alloy layer. The first structure may include the first switching element, and a first intermediate electrode between the first resistance-changing layer and the first switching element.

The first intermediate electrode may include the alloy layer. The first switching element may be a first oxide diode. The first resistance-changing layer, the first intermediate electrode, the first switching element and the at least one second electrode may be sequentially formed on the at least one first electrode. The first switching element, the first intermediate electrode, the first resistance-changing layer and the at least one second electrode may be sequentially formed on the at least one first electrode.

The at least one first and second electrodes may be a plurality of wires crossing each other, and the first structure may be at an intersection between the at least one first and second electrodes. The device may further include at least one third electrode spaced apart from the at least one second electrode, a second structure including a second resistance-changing layer between the at least one second electrode and the at least one third electrode, and a second switching element electrically connected to the second resistance-changing layer. The at least one third electrode may include the alloy layer.

The second structure may include the second switching element, and a second intermediate electrode between the second resistance-changing layer and the second switching element. The second intermediate electrode may include the alloy layer. The second switching element may be a second oxide diode. The second resistance-changing layer, the second intermediate electrode, the second switching element and the at least one third electrode may be sequentially formed on the at least one second electrode. The second switching element, the second intermediate electrode, the second resistance-changing layer and the at least one third electrode may be sequentially formed on the at least one second electrode.

The at least one second and third electrodes may be a plurality of wires crossing each other, and the second structure may be at an intersection between the at least one second and third electrodes. The RRAM may be a multi-layer cross point RRAM having a one diode-one resistor (1D-1R) cell structure. A first resistance-changing layer may include an element that may be reversibly converted from a higher resistance state to a lower resistance state, or from a lower resistance state to a higher resistance state. The first resistance-changing layer may include an element that may be irreversibly converted from a higher resistance state to a lower resistance state.

BRIEF DESCRIPTION OF THE DRAWINGS

Example embodiments will be more clearly understood from the following detailed description taken in conjunction with the accompanying drawings. FIGS. 1-9C represent non-limiting, example embodiments as described herein.

FIG. 1 is a perspective view of a resistive random access memory (RRAM) device according to example embodiments;

FIG. 3 is a plan view of an RRAM device according to example embodiments;

FIG. 6 is a graph showing the voltage-current characteristics of a RRAM manufactured according to a comparative example;

FIGS. 7 and 8 are graphs showing the resistance change according to the number of switchings of RRAMs manufactured according to example embodiments and the comparative example;

FIG. 9C is an optical microscopic image showing the adhesive characteristics of a sample manufactured according to a comparative example.

Figure 2A:
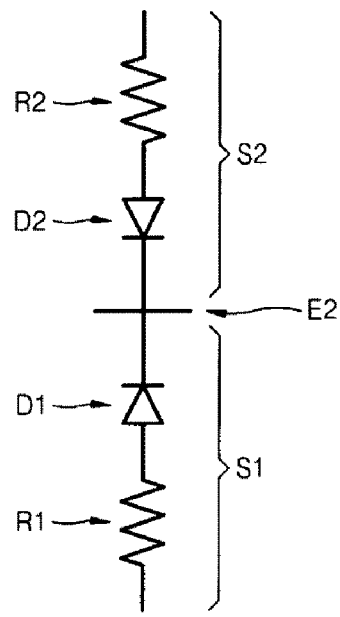
FIGS. 2A and 2B are circuit views of the RRAM device of FIG. 1.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. In the drawings, the thicknesses of layers and regions are exaggerated for clarity, and the same reference numerals in the drawings denote the same element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a resistive random access memory (RRAM) device according to example embodiments. The RRAM may be a multi-layer cross point RRAM. Referring to FIG. 1, a plurality of first electrodes E1 may be formed at equal distance to each other on a substrate (not shown). The first electrodes E1 may each have a wire shape. Wire shaped second electrodes E2 may be formed at equal distances to each other a predetermined or given distance apart from the upper surfaces of the first electrodes E1. The second electrodes E2 may cross the first electrodes E1, and may be perpendicular to the first electrodes E1.

At least one of the first and second electrodes E1 and E2 may include an alloy layer formed of at least a binary alloy which may include a noble metal and a base metal. The noble metal may be in contact with a p-type oxide, e.g., NiO, to exhibit switching characteristics, may be in contact with a p-type semiconductor layer of a diode to exhibit ohmic characteristics, and may have a work function equal to or greater than about 5 eV. For example, the noble metal may be any one selected from Pt, Ir, Ru, Pd and Au.

The base metal may have a work function equal to or less than about 5 eV, and may function of increasing an adhesive strength of the alloy layer. The base metal may be, for example, Ni or Ti, but example embodiments are not limited thereto. For example, the alloy layers of the first and second electrodes E1 and E2 may each be a Pt—Ti alloy layer or a Pt—Ni alloy layer. In the Pt—Ti alloy layer, the context X (mol %) of Ti may be about $0<X\leq$ about 40, and in the Pt—Ni alloy layer, the content Y (mol %) of Ni may be about $0<Y\leq$ about 90. The alloy layers may be formed using physical vapor deposition (PVD), e.g., co-sputtering, but various methods may be used. A plurality of first structures S1 may be formed at intersections between the first electrodes E1 and the second electrodes E2.

Referring to a magnified portion in FIG. 1, the first structures S1 may include a first resistance-changing layer R1, a first intermediate electrode M1 and a first diode D1, which may be sequentially formed on the first electrode E1. The first resistance-changing layer R1 may be formed of a variable resistance material (e.g., transition metal oxide (TMO)). For example, the first resistance-changing layer R1 may be formed of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, or Ta oxide. The first intermediate electrode M1 may electrically connect the first resistance-changing layer R1 to the first diode D1, and may include the above-described alloy metal. Without the first intermediate electrode M1, because the first diode D1 may function as a resistor, the first diode D1 may adversely affect the operation of the RRAM device. Without the first intermediate electrode M1, when the first resistance-changing layer R1 is set, the first diode D1 may be damaged, and accordingly, the rectifying characteristic of the first diode D1 may be lost. The first resistance-changing layer R1, the first diode D1 and the first intermediate electrode M1 may have dot shapes having similar sizes, but example embodiments are not limited thereto. The first diode D1 may be a vertical diode, and may be a stack structure in which a p-type oxide layer and an n-type oxide layer are sequentially formed.

Alternatively, the first diode D1 may be configured as a stack structure in which a p-type silicon layer and an n-type silicon layer are sequentially formed. For example, the first diode D1 may be configured as a stack structure in which a p-type oxide layer, e.g., a CuO layer, and an n-type oxide layer, e.g., an InZnO layer, are sequentially formed, or alternatively, may be configured as a stack structure in which a p-type oxide layer, e.g., a NiO layer, and an n-type oxide layer, e.g., a $TiO_2$ layer, may be sequentially formed. With regard to the CuO layer, due to copper (Cu) deficiency that may be spontaneously generated, $O^2$, which may not be coupled to Cu, act as a donor, and thus, the CuO layer may be a p-type semiconductor layer. With regard to the InZnO layer, due to the zinc (Zn) interstitial and the oxygen (O) vacancy which is spontaneously generated, $Zn^{2+}$, which exists out of a lattice or is not coupled to O, may act as an acceptor, and thus, the InZnO layer may be an n-type semiconductor layer.

Oxide layers that may be formed of an amorphous material, and which may be easily formed at a room temperature, may be used for manufacturing the first diode D1, but oxide layers formed of a crystalline material may also be used. With regard to a silicon diode, because the silicon diode needs to be manufactured at a relatively high temperature of about 800° C., various problems may arise at the higher temperature. Thus, in example embodiments, an oxide layer, which may be more easily formed at a room temperature, may be used for forming the first diode D1. A contact electrode (not shown) may be formed between the first diode D1 and the second electrodes E2.

Third electrodes E3 may be formed a predetermined or given distance apart from the upper surfaces of the second electrodes E2. The third electrodes E3 may each have a wire shape, and may be formed at equal distances to each other. The third electrodes E3 may cross the second electrodes E2, and may be perpendicular to the second electrodes E2. The third electrodes E3 may be formed of the same material as the first electrode E1 or the second electrodes E2. A plurality of second structures S2 may be formed at intersections between the second electrodes E2 and the third electrodes E3. The second structures S2 and the first structures S1 may have the same structure or may have structures with reflection symmetry from a circuit point of view. When the first structures S1 includes a stack structure in which the first intermediate electrode M1 and the first diode D1 are sequentially formed on the first resistance-changing layer R1, the second structures S2 may include a stack structure in which a second intermediate electrode and a second resistance-changing layer are sequentially formed on a second diode. The second intermediate electrode may be formed of the same material as the first intermediate electrode M1.

Figure 2B:
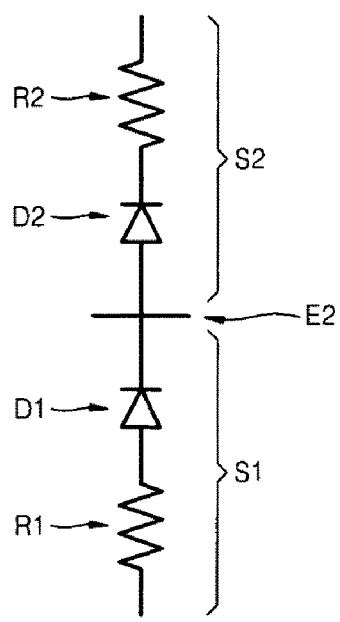

In addition, the first diode D1 of the first structures S1 and the second diode of the second structures S2 may have the same stack structure or may have structures with reflection symmetry from a circuit point of view. For example, the first structures S1, the second electrodes E2 and the second structures S2 may have structures as illustrated in FIG. 2A or 2B from a circuit point of view. In FIGS. 2A and 2B, reference numerals D2 and R2 denote the second diode and the second resistance-changing layer, respectively. In FIGS. 2A and 2B, the rectification directions of the first and second diodes D1 and D2 may be changed. In addition, in the first structures S1, the locations of the first resistance-changing layer R1 and the first diode D1 may be reversed, and in the second structures S2, the locations of the second resistance-changing layer R2 and the second diode D2 may be reversed.

In addition, in FIG. 2A, because the first and second diodes D1 and D2 have structures with reflection symmetry about the second electrodes E2, information may be simultaneously recorded on the first and second resistance-changing layers R1 and R2 by using the second electrodes E2 as a common bit line. On the other hand, in FIG. 2B, because the first and second diodes D1 and D2 have the same rectification direction, information may be recorded on any one of the first and second resistance-changing layers R1 and R2 by using only one programming operation.

Referring back to FIG. 1, the first and second structures S1 and S2 may be illustrated as having cylindrical shapes, but the shapes may be variously changed, e.g., a square pillar shape or a shape where the width increases towards its lower portion. For example, the first and second structures S1 and S2 may have asymmetrical shapes that extend out of the intersections between the first and second electrodes E1 and E2 and the intersections between the second and third electrodes E2 and E3. An example of the first structures S1 having the asymmetrical shapes may be illustrated in FIG. 3.

Figure 3:
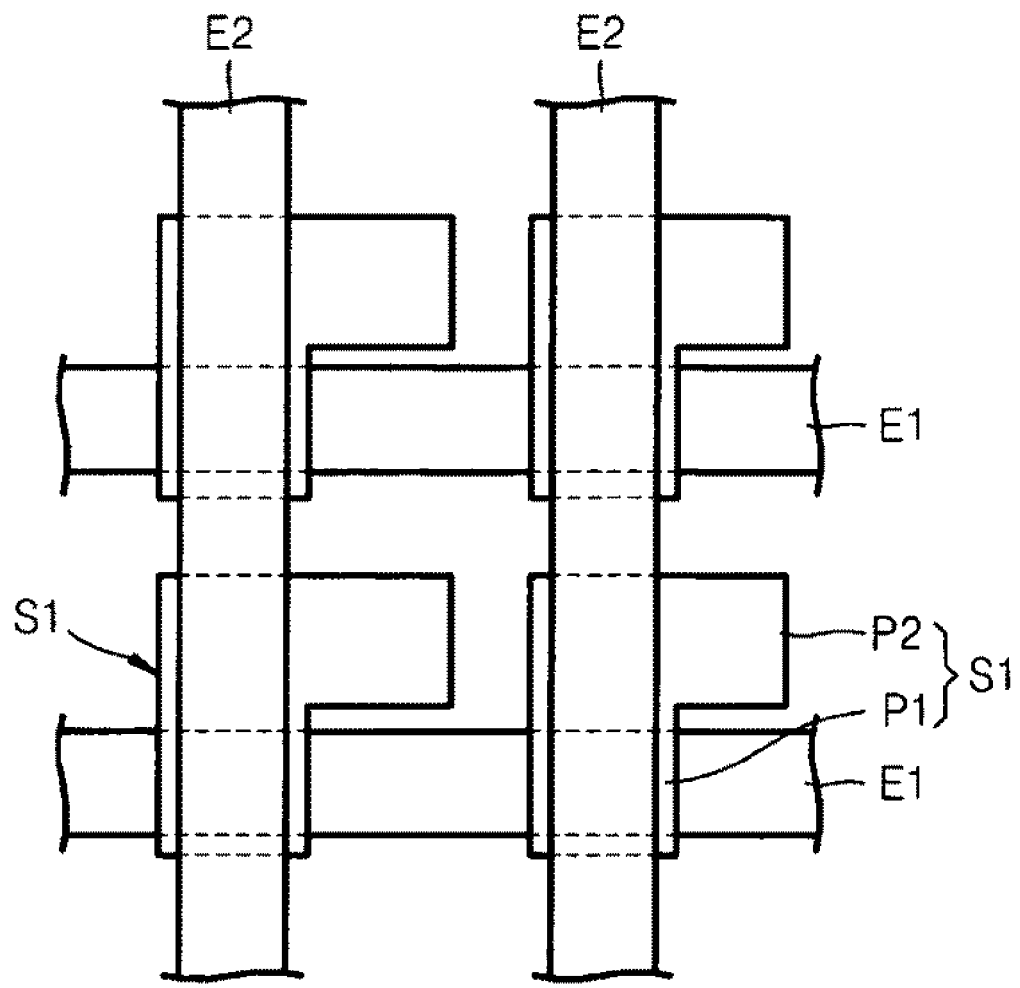

Referring to FIG. 3, the first structures S1 may each include a first portion P1 which may be disposed at an intersection between first and second electrodes E1 and E2, and a second portion P2 which may be in contact with the first portion P1, and extends out of the intersection. The first structures S1 may have asymmetrical shapes that extend out of the intersections between the first and second electrodes E1 and E2. In example embodiments, the first diode D1 and the first resistance-changing layer R1 may have different shapes. For example, the first diode D1 may have an area corresponding to the first portion P1 and the second portion P2, and the first resistance-changing layer R1 may have an area corresponding to the first portion P1. As the area of the first diode D1 increases, the amount of a forward current flowing through the first diode D1 may increase, and accordingly, the switching characteristics may be improved. Although not illustrated, the plan structures of the second structures S2 may be similar to those of the first structures S1 illustrated in FIG. 3.

Although not illustrated in FIG. 1, the multi-layer cross point RRAM according to example embodiments may further include a stack structure having the same stack structure as the first structures S1 and the second electrodes E2 on the third electrodes E3. The multi-layer cross point RRAM according to example embodiments may further include at least one stack structure on the third electrodes E3, wherein in the stack structure, the first structures S1, the second electrodes E2, the second structures S2 and the third electrodes E3 may be sequentially formed.

In addition, the multi-layer cross point RRAM according to example embodiments may further include at least one stack structure on the third electrodes E3, wherein in the stack structure, the first structures S1, the second electrodes E2, the second structures S2, the third electrodes E3, the first structures S1 and the second electrodes E2 may be sequentially formed.

The multi-layer cross point RRAM according to example embodiments may be used as a rewritable memory or a one-time programmable (OTP) memory. When the first and second resistance-changing layers R1 and R2 each include a first element that may be reversibly converted from a higher resistance state to a lower resistance state, or vice versa, the multi-layer cross point RRAM according to example embodiments may be a rewritable memory. An example of the first element may be a material layer formed of the above-described variable resistance material, or a filament fuse. On the other hand, when the first and second resistance-changing layers R1 and R2 each include a second element that may be irreversibly converted from a higher resistance state to a lower resistance state, because a memory cell that is once programmed may not be restored back to an original state, the multi-layer cross point RRAM according to example embodiments may be an OTP memory. An example of the second element is an antifuse that is formed of an oxide or a nitride, for example, silicon oxide, silicon nitride, or aluminum oxide.

FIGS. 4A, 4B, 4C, 4D, 5A and 5B are graphs showing the voltage-current characteristics of RRAMs in which a nickel oxide ($NiO_x$) layer may be used as a resistance-changing layer between upper and lower electrodes formed of alloys. FIGS. 4A, 4B, 4C, 4D, 5A and 5B show the current-voltage characteristics of first through sixth RRAM samples according to example embodiments. The first through sixth RRAM samples may each include a nickel oxide ($NiO_x$) layer that is used as a resistance-changing layer between upper and lower electrodes. In the first through fourth RRAM samples, the upper and lower electrodes may each be formed of a Pt—Ni alloy, and in the fifth and sixth RRAM samples, the upper and lower electrodes may each be formed of a Pt—Ti alloy. The contents of Ni of the upper and lower electrodes in the first through fourth RRAM samples may be 10 mol %, 51 mol %, 73 mol %, and 83 mol %, respectively, and the contents of Ti of the upper and lower electrodes in the fifth and sixth RRAM samples may be 11 mol % and 22 mol %, respectively.

Figure 4A:
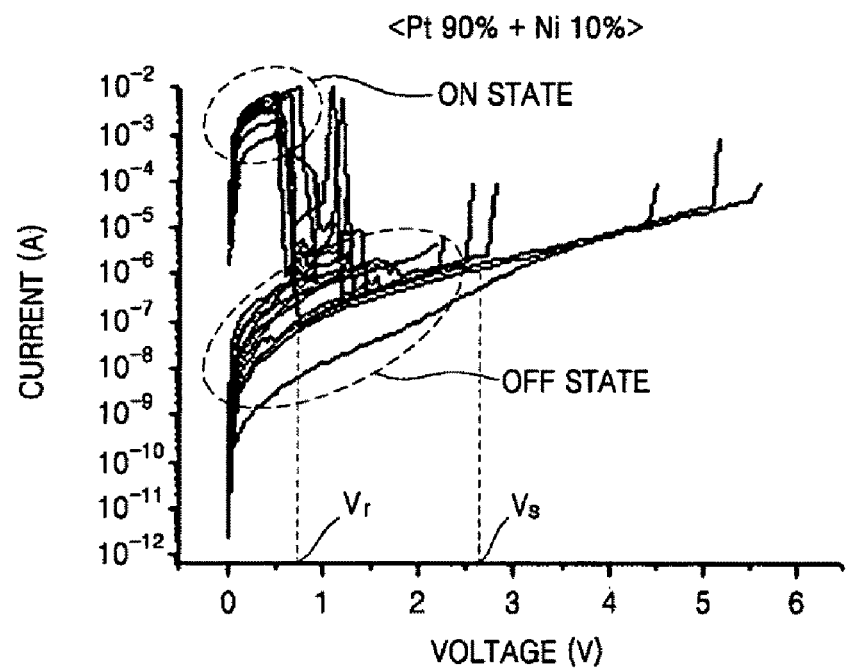
FIGS. 4A, 4B, 4C, 4D, 5A and 5B are graphs showing the voltage-current characteristics of RRAMs manufactured according to example embodiments.
Figure 4B:
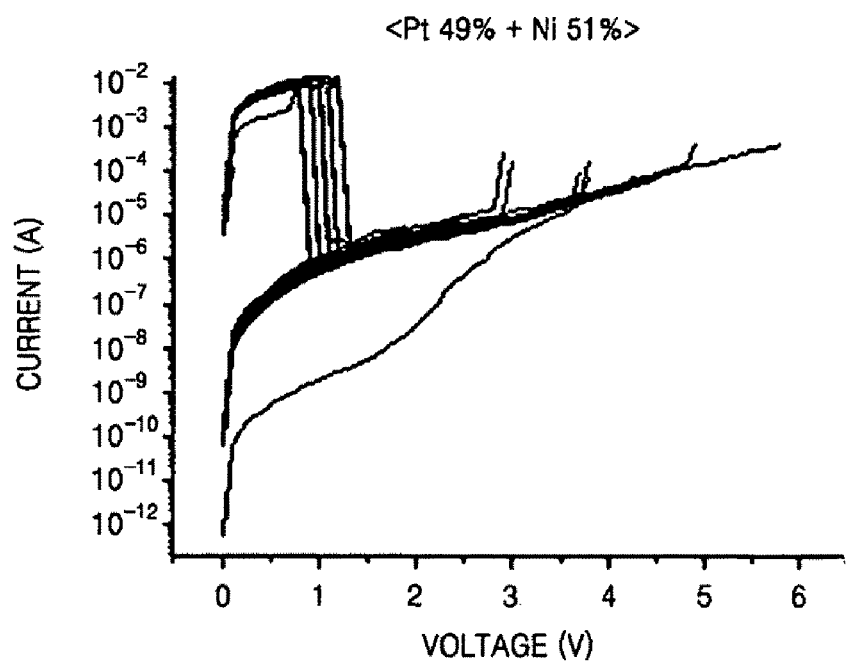
Figure 6:
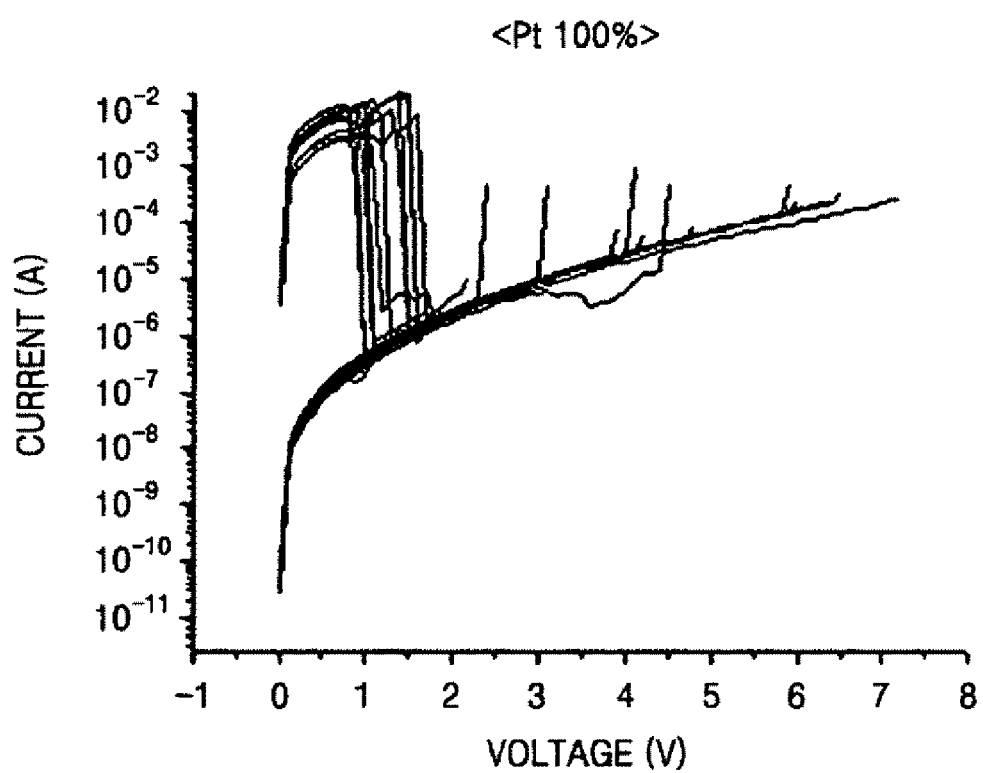

FIG. 6 is a graph showing the current-voltage characteristics of a seventh RRAM sample, wherein the seventh RRAM sample has the same structure as the first RRAM sample except that upper and lower electrodes may be formed of Pt. Referring to FIGS. 4A and 6, the first RRAM sample shows similar switching characteristics to that of the seventh RRAM sample. As illustrated in FIG. 4A, when a voltage equal to or greater than a set voltage Vs is applied to the resistance-changing layer between the upper and lower electrodes, the resistance of the resistance-changing layer may be reduced, which corresponds to an ON state. When a voltage equal to or greater than a reset voltage Vr is applied to the resistance-changing layer, the resistance of the resistance-changing layer may increase, which corresponds to an OFF state. FIG. 6 shows the same result. This result denotes that a Pt—Ni alloy may be used for forming an electrode of an RRAM.

Figure 4C:
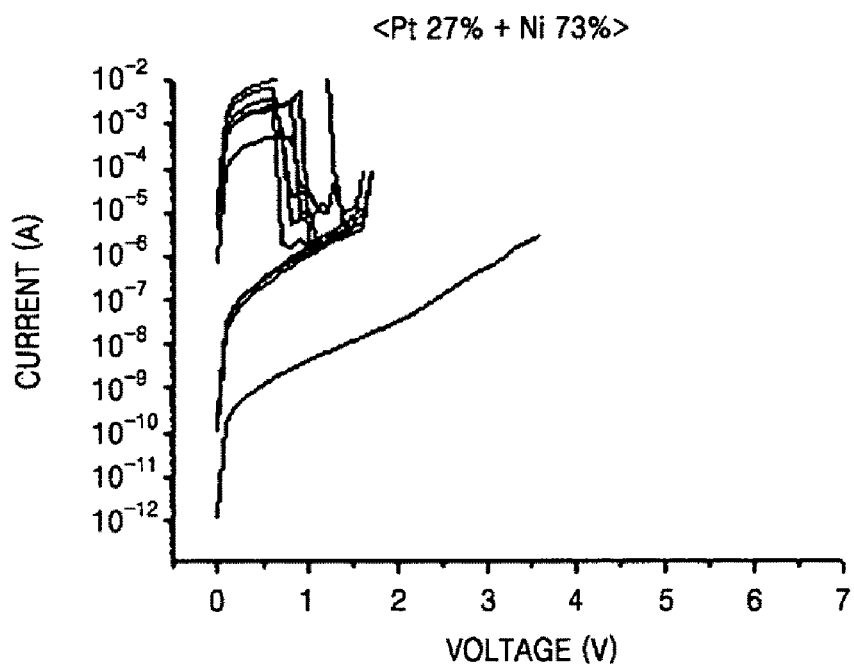
Figure 4D:
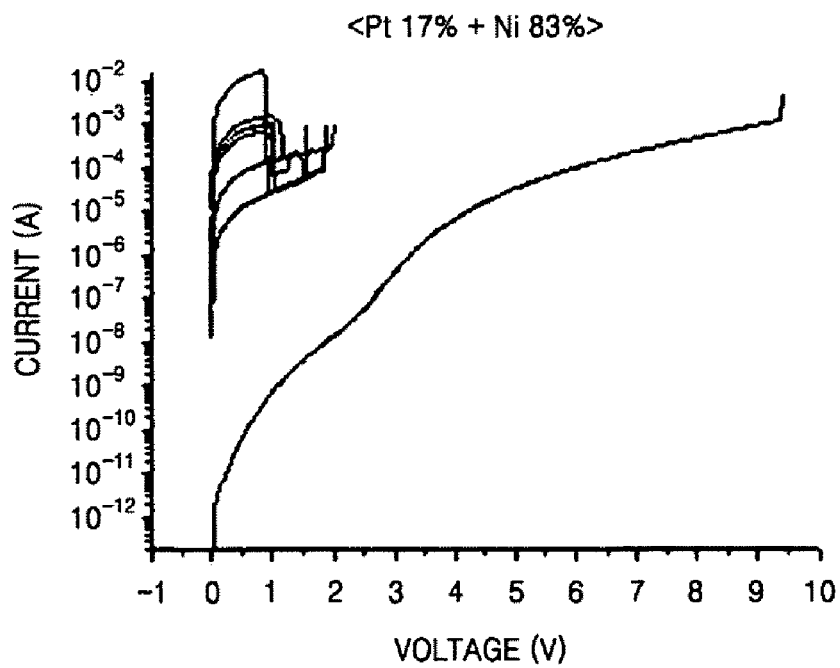
Figure 5A:
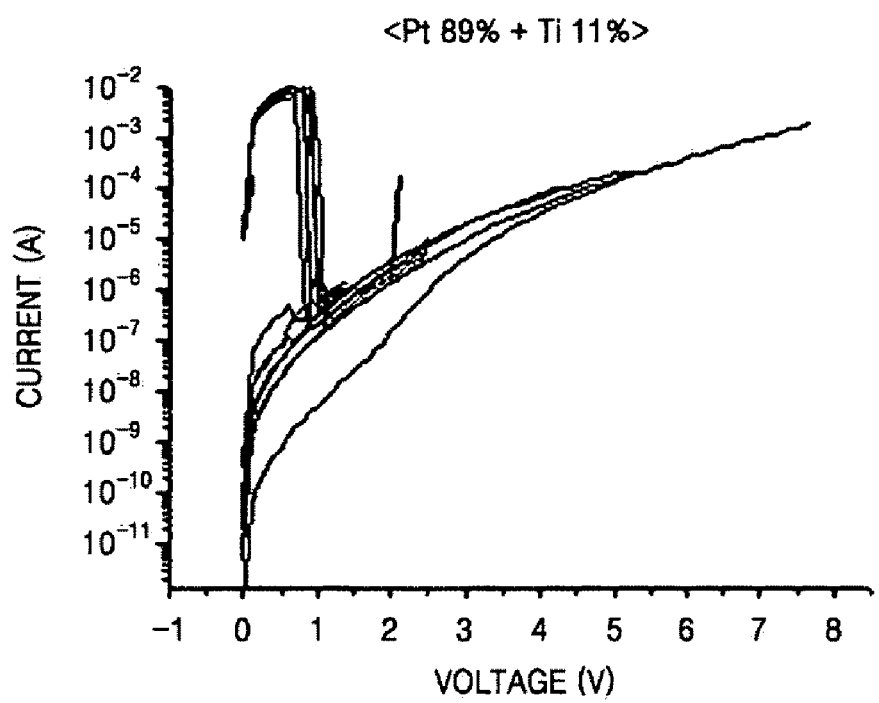
Figure 5B:
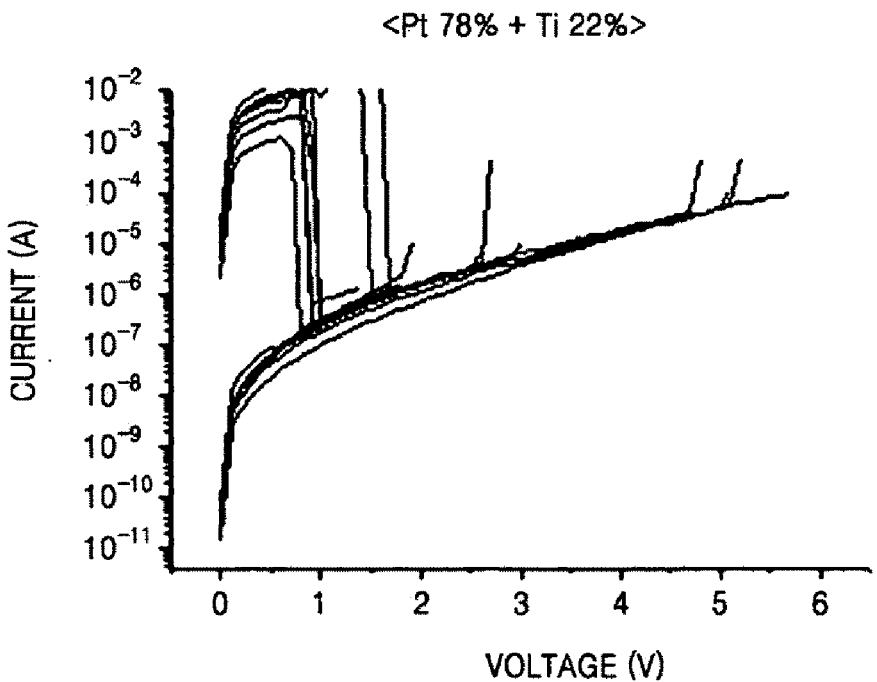

Referring to FIGS. 4A and 4C, the second and third RRAM samples show similar switching characteristics to that of the seventh RRAM sample illustrated in FIG. 6. Referring to FIG. 4D, the fourth RRAM sample shows switching characteristics even though the OFF resistance may be relatively small. Thus, a Pt—Ni alloy, which contains nickel (Ni) of about 80 mol % or more, may be used for forming an electrode of the RRAM. Referring to FIGS. 5A, 5B and 6, the fifth and sixth RRAM samples show similar switching characteristics to that of the seventh RRAM sample. Thus, a Pt—Ti alloy which contains titanium (Ti) of 20 mol % or more, may be used as an electrode of the RRAM. Thus, according to example embodiments, the manufacturing costs of an RRAM may be reduced compared to where only expensive platinum (Pt) may be used in forming an electrode material.

Figure 7:
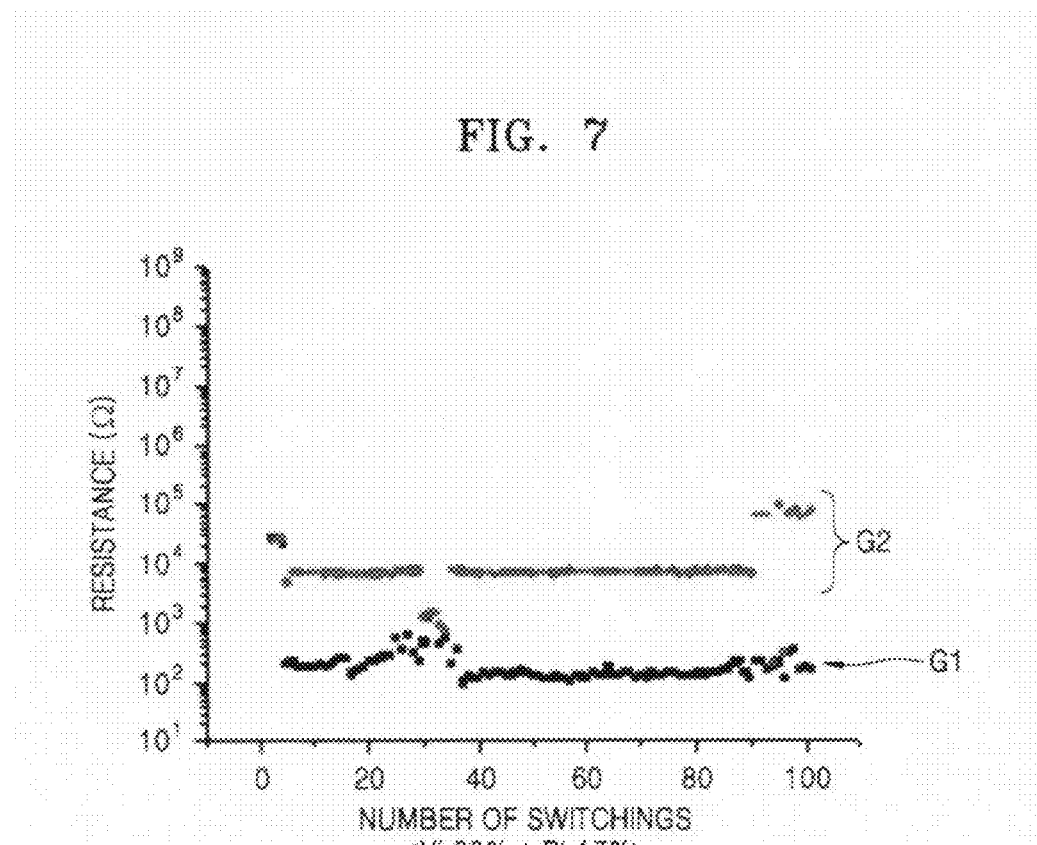
Figure 8:
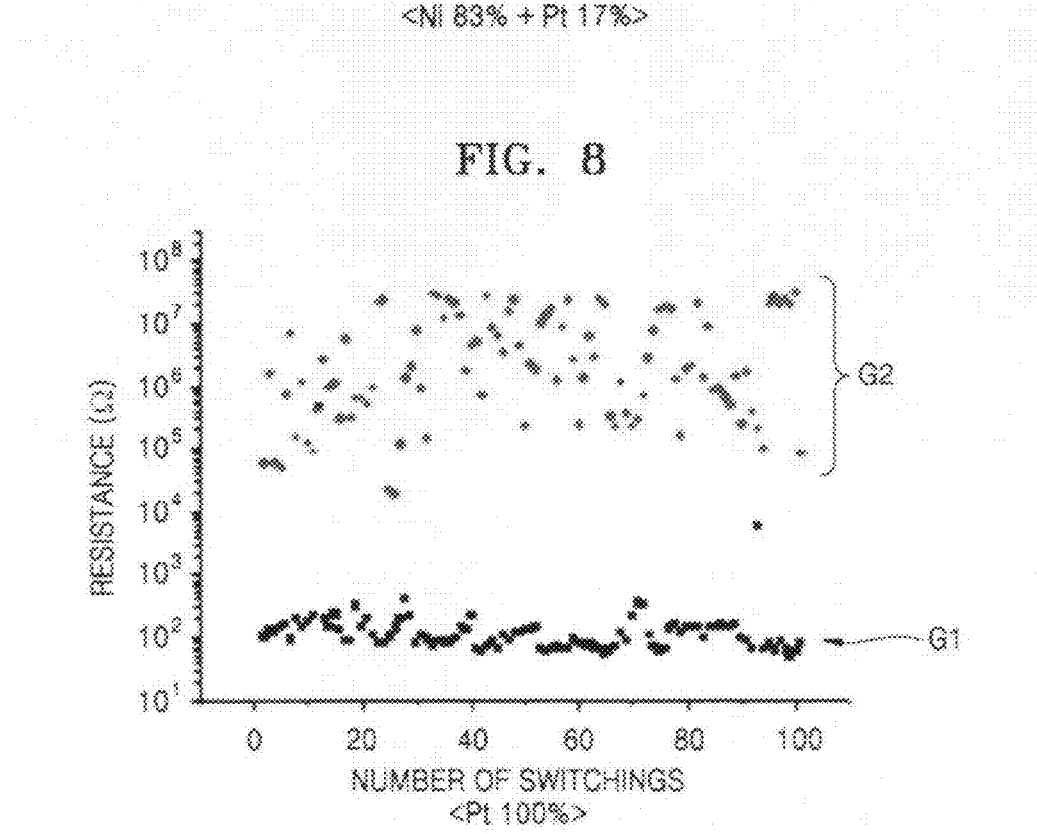

FIGS. 7 and 8 are graphs showing the resistance change according to the number of switchings of the fourth and seventh RRAM samples. In FIGS. 7 and 8, reference numeral G1 denotes a resistance value of the resistance-changing layer in a lower resistance state (e.g., an ON state), and reference numeral G2 denotes a resistance value of the resistance-changing layer in a higher resistance state (e.g., an OFF state). Referring to FIG. 7, a resistance-changing layer of the multi-layer cross point RRAM of example embodiments may have two resistance states. For example, when the resistance-changing layer has a lower resistance value of G1, data '0' may be recorded on the resistance-changing layer. When the resistance-changing layer has a higher resistance value of G2, data '1' may be considered to be recorded on the resistance-changing layer. The distribution of G1 and G2 in FIG. 7 may be smaller than that of G1 and G2 in FIG. 8. The smaller distribution of resistance in a lower or higher resistance state denotes that the device has increased reliability.

Figure 9A:
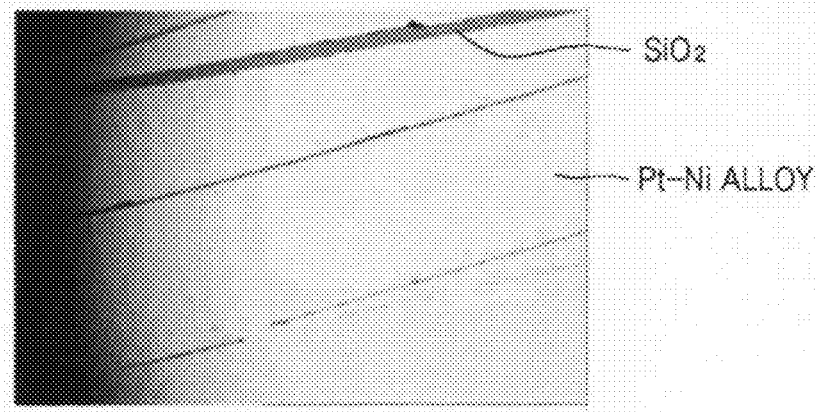
FIGS. 9A and 9B are optical microscopic images showing the adhesive characteristics samples manufactured according to example embodiments.
Figure 9B:
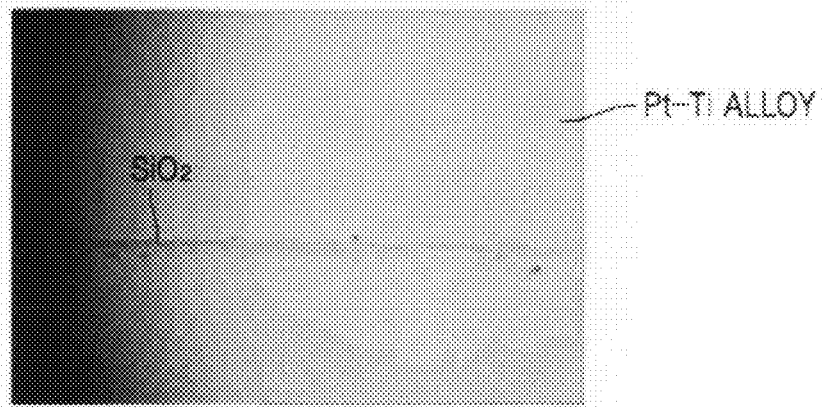
Figure 9C:
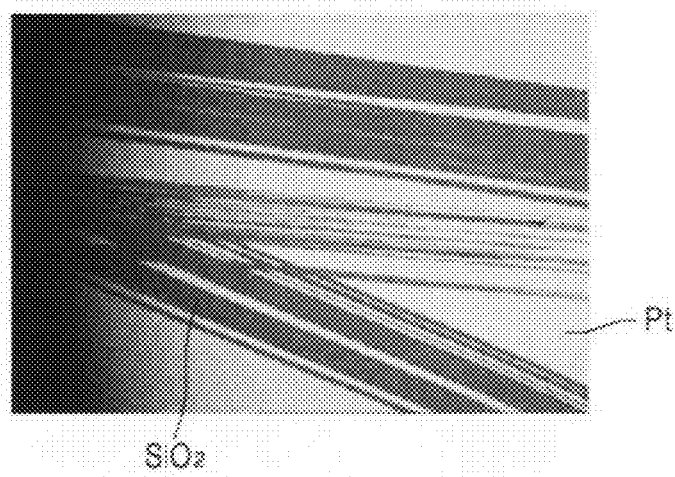

FIGS. 9A-9C are optical microscopic images showing the inspection results of scratches with respect to the eighth through the tenth samples manufactured with different conditions. The eighth sample was manufactured by forming a Pt—Ni alloy layer on a silicon oxide layer, the ninth sample was manufactured by forming a Pt—Ti alloy layer on a silicon oxide layer, and the tenth sample was manufactured by forming a Pt layer on a silicon oxide layer. The surfaces of the eighth through tenth samples were observed after the eighth through tenth samples were randomly disposed adjacent to each other and scratched using a tool, e.g., a pincette.

Referring to FIGS. 9A-9C, the eighth and ninth samples have much smaller and fewer scratches than those of the tenth sample, which denotes that the Pt—Ni alloy layer or the Pt—Ti alloy layer has increased adhesive characteristics than that of the Pt layer. In the case of a conventional RRAM including a Pt layer, due to the undesirable adhesiveness of the Pt layer, an additional adhesion layer must be formed below the Pt layer. However, the multi-layer cross point RRAM according to example embodiments may not require an additional adhesion layer.

While example embodiments have been particularly shown and described with reference to embodiments thereof, it should not be construed as being limited to the embodiments set forth herein but as examples. It will be obvious to those of ordinary skill in this art that, for example, the constituent elements of the RRAM may be varied and the structure of the RRAM may also be modified. Therefore, the scope of example embodiments is defined not by the detailed description of example embodiments but by the appended claims.

What is claimed is:

1. A resistive random access memory (RRAM) device comprising:
    at least one first electrode;
    at least one second electrode spaced apart from the at least one first electrode;
    a first structure including a first resistance-changing layer between the at least one first and second electrodes, the first resistance-changing layer including an oxide; and
    a first switching element electrically connected to the first resistance-changing layer,
    wherein at least one of the first and second electrodes include an alloy layer including a noble metal and a base metal,
    wherein the alloy layer is one of a Pt—Ti alloy layer and a Pt—Ni alloy layer, and
    wherein the first structure includes the first switching element, and a first intermediate electrode between the first resistance-changing layer and the first switching element.

2. The device of claim 1, wherein the content X (mol%) of Ti is about 0<X≦about 40, in the Pt—Ti alloy layer.

3. The device of claim 1, wherein the content Y (mol%) of Ni is about 0<Y≦about 90, in the Pt—Ni alloy layer.

4. The device of claim 1, wherein the first intermediate electrode includes the alloy layer.

5. The device of claim 1, wherein the first switching element is a first oxide diode.

6. The device of claim 1, wherein the first resistance-changing layer, the first intermediate electrode, the first switching element and the at least one second electrode are sequentially formed on the first electrode.

7. The device of claim 1, wherein the first switching element, the first intermediate electrode, the first resistance-changing layer and the at least one second electrode are sequentially formed on the first electrode.

8. The device of claim 1, wherein the at least one first electrode and the at least one second electrode are a plurality of wires crossing each other, and the first structure is at an intersection between the at least one first electrode and the at least one second electrode.

9. The device of claim 1, wherein the first resistance-changing layer includes an element that is reversibly converted from a high resistance state to a low resistance state, or from a low resistance state to a high resistance state.

10. The device of claim 1, wherein the first resistance-changing layer includes an element that is irreversibly converted from a high resistance state to a low resistance state.

11. A resistive random access memory (RRAM) device comprising:
    at least one first electrode;
    at least one second electrode spaced apart from the at least one first electrode;
    a first structure including a first resistance-changing layer between the at least one first and second electrodes, the first resistance-changing layer including an oxide;
    a first switching element electrically connected to the first resistance-changing in layer;
    at least one third electrode spaced apart from the at least one second electrode;
    a second structure including a second resistance-changing layer between the at least one second electrode and the at least one third electrode, the second resistance-changing layer including an oxide; and
    a second switching element electrically connected to the second resistance-changing layer,
    wherein at least one of the first and second electrodes include an alloy layer including a noble metal and a base metal, and
    wherein the alloy layer is one of a Pt—Ti alloy layer and a Pt—Ni alloy layer.

12. The device of claim 11, wherein the at least one third electrode includes the alloy layer.

13. The device of claim 11, wherein the second structure includes the second switching element, and a second intermediate electrode between the second resistance-changing layer and the second switching element.

14. The device of claim 13, wherein the second intermediate electrode includes the alloy layer.

15. The device of claim 13, wherein the second switching element is a second oxide diode.

16. The device of claim 13, wherein the second resistance-changing layer, the second intermediate electrode, the second switching element and the at least one third electrode are sequentially formed on the second electrode.

17. The device of claim 13, wherein the second switching element, the second intermediate electrode, the second resistance-changing layer and the at least one third electrode are sequentially formed on the second electrode.

18. The device of claim 13, wherein the at least one second electrode and the at least one third electrode are a plurality of wires crossing each other, and the second structure is at an intersection between the at least one second electrode and the at least one third electrode.

19. The device of claim 18, wherein the RRAM is a multi-layer cross point RRAM having a one diode-one resistor (1D-1R) cell structure.

20. The device of claim 11, wherein the content X (mol%) of Ti is about 0<X≦about 40, in the Pt—Ti alloy layer.

21. The device of claim 11, wherein the content Y (mol%) of Ni is about 0<Y≦about 90, in the Pt—Ni alloy layer.

22. The device of claim 11, wherein the first resistance-changing layer includes an element that is reversibly converted from a high resistance state to a low resistance state, or from a low resistance state to a high resistance state.

23. The device of claim 11, wherein the first resistance-changing layer includes an element that is irreversibly converted from a high resistance state to a low resistance state.

* * * * *